United States Patent
Maeno et al.

(10) Patent No.: US 9,643,415 B2
(45) Date of Patent: May 9, 2017

(54) PIEZOELECTRIC SUBSTRATE, ASSEMBLY, LIQUID DISCHARGE HEAD, AND RECORDING DEVICE, EACH USING PIEZOELECTRIC SUBSTRATE

(71) Applicant: KYOCERA Corporation, Kyoto-shi, Kyoto (JP)

(72) Inventors: Takanori Maeno, Higashine (JP); Takahiro Nakamura, Kirishima (JP)

(73) Assignee: Kyocera Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 15/039,974

(22) PCT Filed: Nov. 21, 2014

(86) PCT No.: PCT/JP2014/080926
§ 371 (c)(1),
(2) Date: May 27, 2016

(87) PCT Pub. No.: WO2015/080054
PCT Pub. Date: Jun. 4, 2015

(65) Prior Publication Data
US 2017/0001440 A1    Jan. 5, 2017

(30) Foreign Application Priority Data

Nov. 29, 2013  (JP) ................................. 2013-247853
Jan. 28, 2014  (JP) ................................. 2014-013456

(51) Int. Cl.
*B41J 2/14*       (2006.01)
*H01L 41/047*  (2006.01)

(52) U.S. Cl.
CPC ....... *B41J 2/14072* (2013.01); *B41J 2/14201* (2013.01); *H01L 41/047* (2013.01); *H01L 41/0475* (2013.01); *B41J 2002/14491* (2013.01)

(58) Field of Classification Search
CPC  B41J 2/14072; B41J 2/04521; B41J 2/04548; B41J 2002/14491; B41J 2/14201;
(Continued)

(56) References Cited

U.S. PATENT DOCUMENTS

2005/0062807 A1   3/2005  Ito et al.
2006/0066691 A1   3/2006  Sakaida et al.
(Continued)

FOREIGN PATENT DOCUMENTS

EP    1516732 A1    3/2005
EP    1642719 A1    4/2006
(Continued)

OTHER PUBLICATIONS

International Search Report, PCT/JP2014/080926, Feb. 24, 2015, 2 pgs.

*Primary Examiner* — Geoffrey Mruk
(74) *Attorney, Agent, or Firm* — Volpe and Koenig, P.C.

(57) ABSTRACT

The present invention aims at providing a piezoelectric substrate that is less susceptible to the influence of adhesive after being subjected to connection, as well as an assembly, a liquid discharge head, and a recording device, each of which uses the piezoelectric substrate. The piezoelectric substrate of the present invention is a flat plate shaped piezoelectric substrate including a piezoelectric ceramic layer, a plurality of first electrodes, a second electrode, and a third electrode. The second electrode includes an outer peripheral part disposed so as to surround the entirety of the first electrodes, and a protrusion extending from the outer
(Continued)

peripheral part toward the inside of the outer peripheral part when the piezoelectric substrate is viewed from above. The second electrode and the third electrode are electrically connected to each other at the protrusion. The outer peripheral part is used for an electrical connection with the outside.

14 Claims, 7 Drawing Sheets

(58) Field of Classification Search
CPC . B41J 2/14233; B41J 2/14258; H01L 41/047; H01L 41/0475; H01L 41/0477
See application file for complete search history.

(56) References Cited

U.S. PATENT DOCUMENTS

| | | | |
|---|---|---|---|
| 2007/0236544 A1 | 10/2007 | Ito et al. | |
| 2008/0049077 A1 | 2/2008 | Sugahara | |
| 2009/0219346 A1* | 9/2009 | Suzuki | B41J 2/04581 347/68 |
| 2013/0084199 A1* | 4/2013 | Tanaka | H01L 41/0805 417/413.2 |

FOREIGN PATENT DOCUMENTS

| | | |
|---|---|---|
| JP | 2005-088516 A | 4/2005 |
| JP | 2006-082356 A | 3/2006 |
| JP | 2006-123519 A | 5/2006 |
| JP | 2007-203481 A | 8/2007 |
| JP | 2008-074091 A | 4/2008 |
| JP | 2012-206442 A | 10/2012 |

* cited by examiner

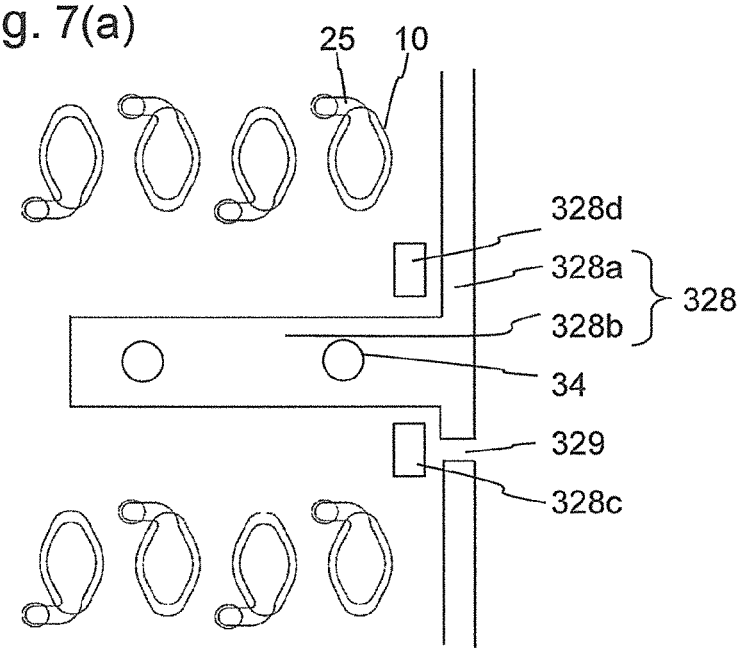
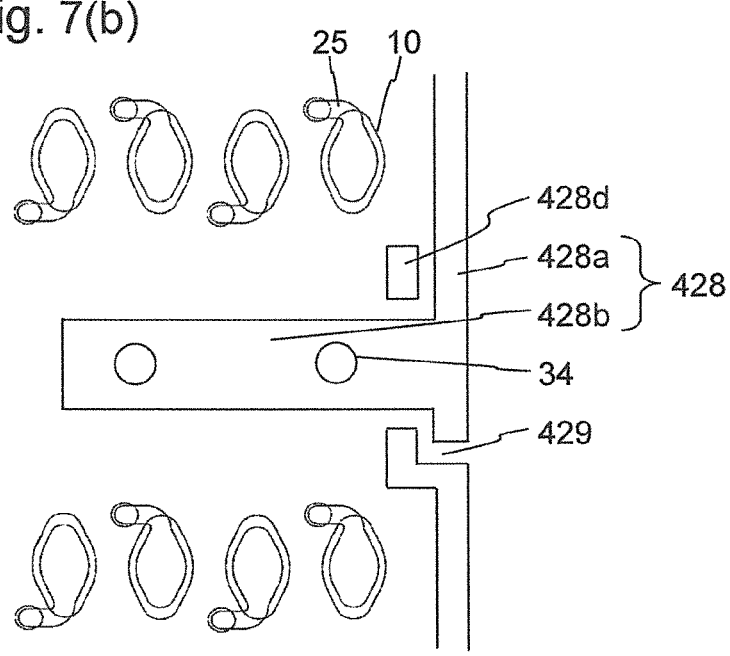

PIEZOELECTRIC SUBSTRATE, ASSEMBLY, LIQUID DISCHARGE HEAD, AND RECORDING DEVICE, EACH USING PIEZOELECTRIC SUBSTRATE

TECHNICAL FIELD

The present invention relates to a piezoelectric substrate, as well as an assembly, a liquid discharge head, and a recording device, each of which uses the piezoelectric substrate.

BACKGROUND ART

As a liquid discharge head, there has conventionally been known, for example, an inkjet head that carries out various kinds of printings by discharging a liquid onto a recording medium. The liquid discharge head includes a flow channel member having a plurality of discharge holes and a plurality of pressurizing chambers, and a piezoelectric actuator substrate. The flow channel member and the piezoelectric actuator substrate are connected to each other with an adhesive (for example, refer to Patent Document 1).

PRIOR ART DOCUMENT

Patent Document

Patent Document 1: Japanese Patent Unexamined Publication No. 2006-123519

SUMMARY OF THE INVENTION

Problems to be Solved by the Invention

In the liquid discharge head as described in Patent Document 1, there has been a possibility that part of the adhesive that connects the piezoelectric actuator substrate and the flow channel member reaches a displacement element from an outer side of the piezoelectric actuator substrate. Therefore, there has been the problem that displacement characteristics of the displacement element varies due to the influence of the adhesive, discharge characteristics (such as a discharge velocity and an amount of discharge) of the liquid vary, and the liquid cannot be discharged occasionally.

Accordingly, the present invention aims at providing a piezoelectric substrate that is less susceptible to the influence of adhesive after being subjected to connection, as well as an assembly, a liquid discharge head, and a recording device, each of which uses the piezoelectric substrate.

Means for Solving the Problems

A piezoelectric substrate of the present invention is a flat plate shaped piezoelectric substrate including a piezoelectric ceramic layer, a plurality of first electrodes and a second electrode disposed on one main surface of the piezoelectric ceramic layer, and a third electrode disposed on another main surface of the piezoelectric ceramic layer so as to oppose to the first electrodes. The second electrode includes an outer peripheral part disposed so as to surround the entirety of the first electrodes, and a protrusion extending from the outer peripheral part toward the inside of the outer peripheral part when the piezoelectric substrate is viewed from above. The second electrode and the third electrode are electrically connected to each other at the protrusion. The outer peripheral part is used for an electrical connection with an outside.

An assembly of the present invention includes the piezoelectric substrate, and a wiring board that is disposed to face the piezoelectric substrate and includes a plurality of wiring lines electrically connected to the first electrodes and the second electrode. The wiring board is long in one direction, and the wiring lines extend along the one direction. The outer peripheral part has a shape along sides of a rectangular shape. Two opposing sides of the outer peripheral part are disposed along the one direction. The second electrode and each of the wiring lines are electrically connected to each other on the two sides of the second electrode.

A liquid discharge head of the present invention includes a flow channel member including a plurality of discharge holes and a plurality of pressurizing chambers respectively connected to the discharge holes, and the piezoelectric substrate. The flow channel member and the piezoelectric substrate are connected to each other with an adhesive. Upon application of a voltage to between the first electrode and the second electrode, the piezoelectric ceramic layer is deformed to pressurize a liquid in the pressurizing chambers.

A liquid discharge head of the present invention includes a flow channel member including a plurality of discharge holes and a plurality of pressurizing chambers respectively connected to the discharge holes, and the assembly according to claim 3. The flow channel member and the piezoelectric substrate are connected to each other with an adhesive. Upon application of a voltage to between the first electrode and the second electrode, the piezoelectric ceramic layer is deformed to pressurize a liquid in the pressurizing chambers.

A recording device of the present invention includes the liquid discharge head, a transport section to transport a recording medium to the liquid discharge head, and a control section to control the liquid discharge head.

Effect of the Present Invention

With the piezoelectric substrate of the present invention, the outer peripheral part of the second electrode makes it difficult for the adhesive to reach the first electrode. The electrical connection between the second electrode and the third electrode is made by the protrusion, and is therefore less susceptible to the influence of dimensional variations due to the expansion and contraction of the piezoelectric ceramic layer. This permits downsizing of the piezoelectric substrate.

BRIEF DESCRIPTION OF THE DRAWINGS

FIGS. 7(a) and 7(b) are enlarged plan views of a circumference of a protruded part of a piezoelectric substrate according to other embodiment of the present invention.

EMBODIMENTS FOR CARRYING OUT THE INVENTION

Figure 1A:
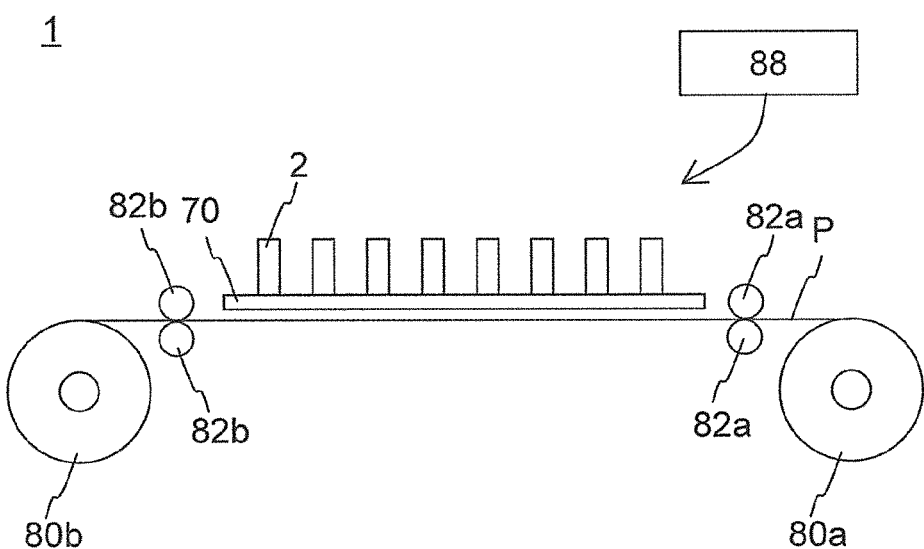
FIG. 1(a) is a side view of a recording device including a liquid discharge head according to an embodiment of the present invention.
Figure 1B:
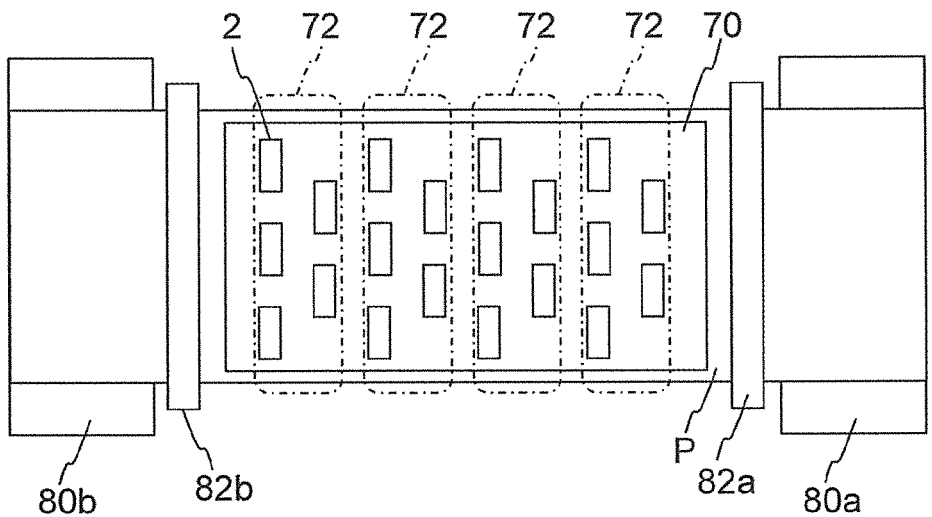
FIG. 1(b) is a plan view thereof.

FIG. 1(a) is a schematic side view of a color inkjet printer 1 (hereinafter also referred to simply as the printer) that is a recording device including a liquid discharge head 2 according to an embodiment of the present invention. FIG. 1(b) is a schematic plan view thereof. The printer 1 relatively moves a printing paper P that is a recording medium with respect to the liquid discharge head 2 by transporting the printing paper P from a transport roller 80a to a transport roller 80b. A control section 88 controls the liquid discharge head 2 on the basis of image data and character data so as to cause a liquid to be discharged toward the recording medium P and cause liquid drops to land on the printing paper P, thereby performing recording, such as printing, on the printing paper P.

In the present embodiment, the liquid discharge head 2 is fixed to the printer 1, and the printer 1 is a so-called line printer. Examples of other embodiments of the recording device of the present invention include a so-called serial printer that alternately performs an operation of moving, such as reciprocating, the liquid discharge head 2 in a direction intersecting with, for example, approximately orthogonal to a transport direction of the printing paper P, and a transport of the printing paper P.

A flat plate shaped head mounting frame 70 (hereinafter also referred to simply as the frame) is fixed to the printer 1 so as to be approximately parallel to the printing paper P. The frame 70 is provided with twenty holes (not shown), and twenty liquid discharge heads 2 are mounted on their respective corresponding hole portions. Liquid discharging portions of the liquid discharge heads 2 are configured to face the printing paper P. A distance between the liquid discharge heads and the printing paper P is set to, for example, approximately 0.5-20 mm. Five liquid discharge heads 2 constitute a head group 72, and the printer 1 has four head groups 72.

The liquid discharge heads 2 have an elongated shape that is long and narrow in a direction from a front side to a rear side in FIG. 1(a), or a vertical direction in FIG. 1(b). The elongated direction is also referred to as a longitudinal direction. Three liquid discharge heads 2 in the head group 72 are disposed along the direction intersecting with, for example, approximately orthogonal to the transport direction of the printing paper P, and the remaining two liquid discharge heads 2 are respectively disposed between the three liquid discharge heads 2 and located at positions deviated from each other along the transport direction. The liquid discharge heads 2 are disposed so that ranges respectively printable by the liquid discharge heads 2 are connected to each other in a width direction of the printing paper P (the direction intersecting the transport direction of the printing paper P), or overlapped with each other via their respective ends. This permits printing without leaving any blank space in the width direction of the printing paper P.

The four head groups 72 are disposed along the transport direction of the recording paper P. A liquid, such as ink, is supplied from a liquid tank (not shown) to each of the liquid discharge heads 2. Inks of the same color are supplied to the liquid discharge heads 2 belonging to the single head group 72, and inks of four colors are printable by the four head groups. The colors of inks to be discharged from the head groups 72 are, for example, magenta (M), yellow (Y), cyan (C), and black (K). A color image is printable by printing these inks under the control of the control section 88.

The number of the liquid discharge heads 2 mounted on the printer 1 may be one for printing over the range printable by the single liquid discharge head 2 with a single color. The number of the liquid discharge heads 2 included in the head group 72, and the number of the head groups 72 are suitably changeable according to a printing object and printing conditions. For example, the number of the head groups 72 may be increased in order to perform more multicolor printing. Even when used the liquid discharge heads 2 having the same performance, a transport velocity can be increased by disposing the head groups 72 that perform printing with the same color and cause these head groups 72 to alternately perform printing in the transport direction. This ensures a large printing area per time. Alternatively, resolution in the width direction of the printing paper P may be enhanced by preparing the head groups 72 that perform printing with the same color, and disposing these head groups 72 with a deviation in the direction intersecting the transport direction.

Besides printing colored inks, a liquid, such as coating agent, may be printed in order to carry out surface treatment of the printing paper P.

The printer 1 performs printing on the printing paper P as a recording medium. The printing paper P is being wound up onto a paper feed roller 80a. After the printing paper P passes through between two guide rollers 82a, the printing paper P passes under the liquid discharge heads 2 mounted on the frame 70, and then passes through between two transport rollers 82b, and is finally recovered onto a recovery roller 80b. When performing printing, the printing paper P is transported at a constant velocity and subjected to printing by the liquid discharged heads 2 by rotating the transport rollers 82b. The recovery roller 80b winds up the printing paper P fed out of the transport rollers 82b. The transport velocity is set to, for example, 75 m/min. Each of these rollers may be controlled by the control section 88, or may be manually operated by an operator.

The recording medium may be a roll-shaped cloth besides the printing paper P. The printer 1 may be configured to directly transport a transport belt with the recording medium mounted on the transport belt, instead of directly transporting the printing paper P. With this configuration, it is possible to employ, as a recording medium, sheet papers, cut cloths, wood, tiles, or the like. Further, for example, wiring patterns of electronic devices may be printed by causing a liquid containing conductive particles to be discharged from the liquid discharge heads 2. Furthermore, chemicals may be manufactured by causing a predetermined amount of each of a liquid chemical agent and a liquid containing a chemical agent to be discharged from the liquid discharge heads 2 toward a reaction vessel or the like, followed by a reaction therebetween.

For example, a position sensor, a velocity sensor, and a temperature sensor may be attached to the printer 1, and the control section 88 may control components of the printer 1 according to states of the components of the printer 1, which are revealed from information from these sensors. For example, when a temperature of the liquid discharge heads 2, a temperature of the liquid in the liquid tank, and a pressure applied to the liquid discharge heads 2 by the liquid in the liquid tank affect discharge characteristics of the liquid to be discharged (such as a discharge rate and a discharge velocity), it may be configured to change a drive signal for discharging the liquid in the liquid discharge heads 2 according to their respective information.

Figure 2:
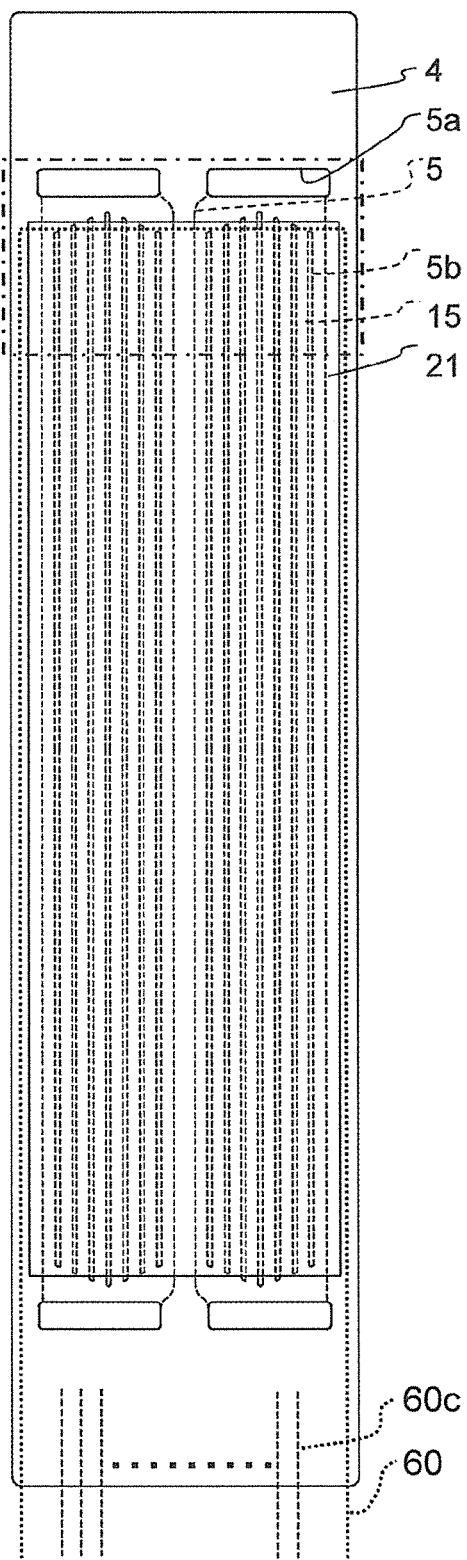
FIG. 2 is a plan view of a head body that is a main part of the liquid discharge head of FIG. 1.
Figure 3:
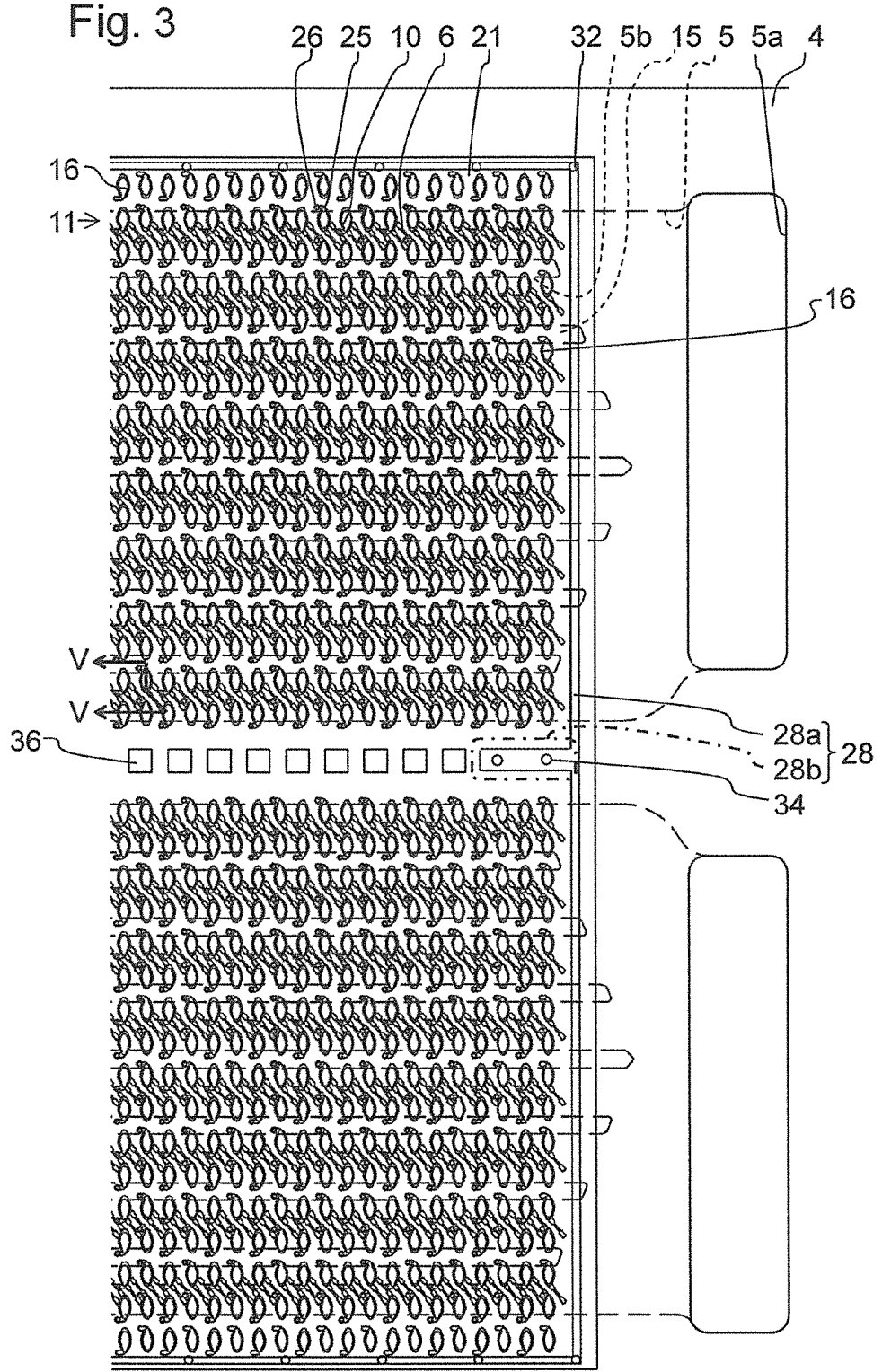
FIG. 3 is an enlarged view of a region surrounded by a chain line in FIG. 2(a), from which some of flow channels are omitted for the sake of description.
Figure 4:
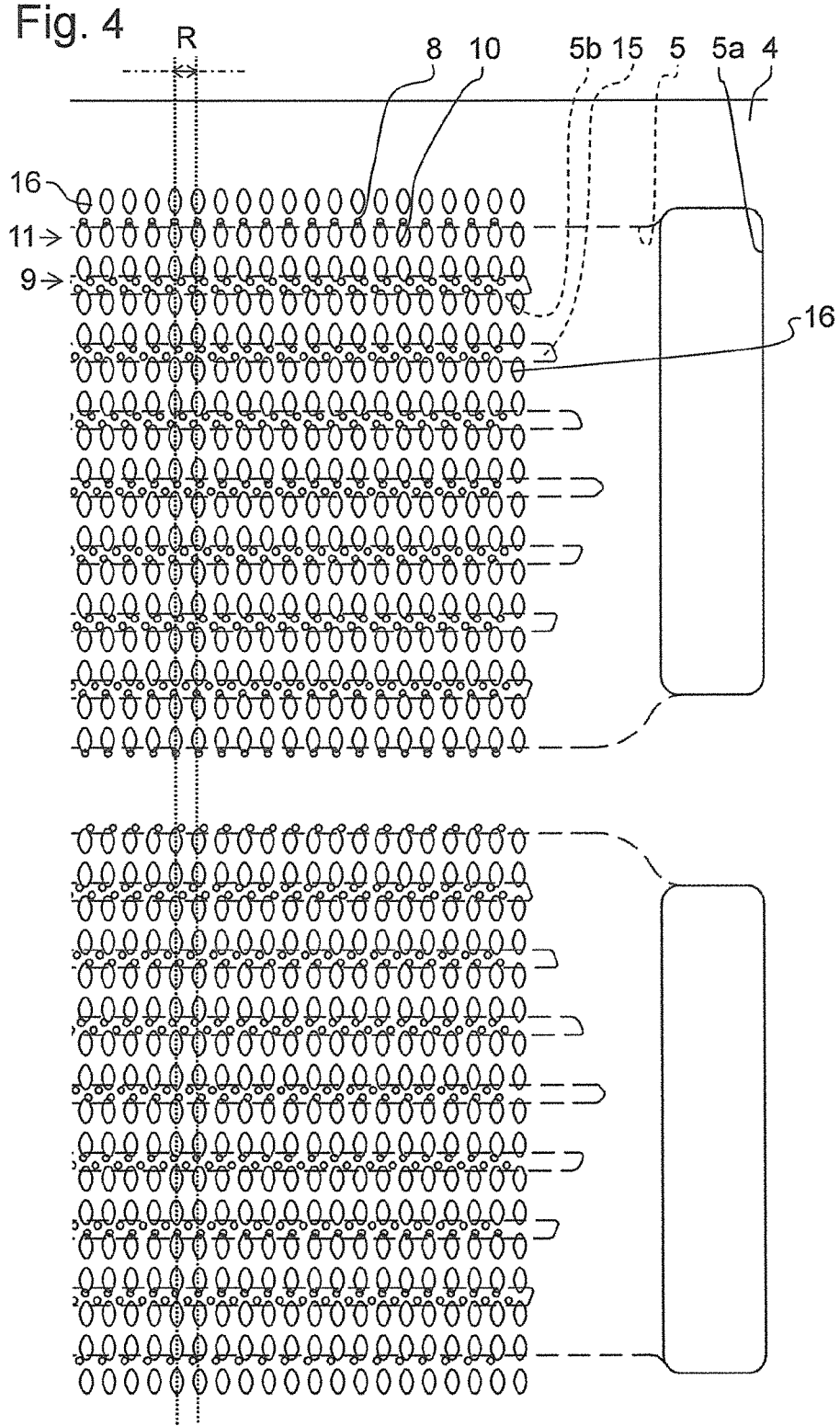
FIG. 4 is an enlarged view of the region surrounded by the chain line in FIG. 2(a), from which some of the flow channels are omitted for the sake of description.
Figure 5:
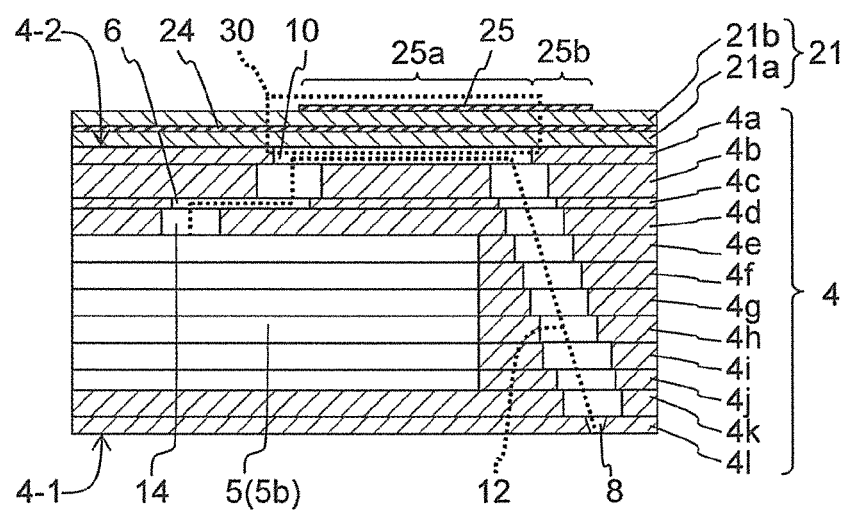
FIG. 5 is a longitudinal sectional view taken along line V-V in FIG. 3.

The liquid discharge head 2 according to the embodiment of the present invention is described below. FIG. 2 is a plan view showing a head body 2a that is a main component of the liquid discharge head 2 shown in FIG. 1. FIG. 3 is an enlarged plan view of a region surrounded by a chain line in FIG. 2, showing a part of the head body 2a. Some of flow channels are omitted in FIG. 3 for the sake of description. FIG. 4 is an enlarged plan view at the same position as in FIG. 3, in which some of the flow channels that differ from those in FIG. 3 are omitted. In FIGS. 3 and 4, for the purpose of further clarification of the drawings, pressurizing chambers 10, apertures 6, and the discharge holes 8, which are located below a piezoelectric actuator substrate 21 and therefore should be drawn by a dashed line, are drawn by a solid line. FIG. 5 is a longitudinal sectional view taken along line V-V in FIG. 3.

Each of the liquid discharge heads 2 may include, besides the head body 2a, a reservoir that supplies a liquid to the head body 2a, and a metal casing. The head body 2a includes a flow channel member 4 that is a support body, and the piezoelectric actuator substrate 21 that is a piezoelectric substrate in which displacement elements 30 are fabricated.

The flow channel member 4 constituting the head body 2a includes a manifold 5 that is a common flow channel, a plurality of pressurizing chambers 10 respectively connected to the manifold 5, and a plurality of discharge holes 8 respectively connected to the pressurizing chambers 10. The pressurizing chambers 10 open into an upper surface of the flow channel member 4, and the upper surface of the flow channel member 4 serves as a pressurizing chamber surface 4-2. The upper surface of the flow channel member 4 has an opening 5a being connected to the manifold 5. The liquid is to be supplied through the opening 5a.

The piezoelectric actuator substrate 21 including the displacement elements 30 is connected to the upper surface of the flow channel member 4 with an adhesive, and the displacement elements 30 are disposed so as to be located on the pressurizing chambers 10. A signal transmission section 60, such as an FPC (flexible printed circuit), for supplying signals to the displacement elements 30 is connected to the piezoelectric actuator substrate 21. The piezoelectric actuator substrate 21 and the signal transmission section 60 are collectively referred to as an assembly. In FIG. 2, to make clear a state in which a signal transmission section 60 is connected to the piezoelectric actuator substrate 21, an external form of a region of the signal transmission section 60 which is connected to the piezoelectric actuator substrate 21 is indicated by a dotted line. Electrodes of an wiring line 60c formed on the signal transmission section 60 are disposed in a rectangular form at an end portion of the signal transmission section 60. The signal transmission section 60 is disposed to face the piezoelectric actuator substrate 21 and disposed along the longitudinal direction of the piezoelectric actuator substrate 21. The signal transmission section 60 further extends downward in FIG. 2 and is electrically connected to the control section 88 (through other circuit board as required). A large number of the wiring lines 60c included in the signal transmission section 60 are arranged in a direction intersecting the longitudinal direction of the signal transmission section 60, and extend along the longitudinal direction. The wiring lines 60c in FIG. 2 are schematically shown to make clear an arrangement direction and an extending direction.

The head body 2a has the single piezoelectric actuator substrate 21 including the flat plate shaped flow channel member 4 and the displacement elements 30 adhered onto the flow channel member 4. A planar shape of the piezoelectric actuator substrate 21 is a rectangular shape, and the piezoelectric actuator substrate 21 is disposed on the upper surface of the flow channel member 4 so that the long sides of the rectangular shape extend along the longitudinal direction of the flow channel member 4.

Two manifolds 5 are formed inside the flow channel member 4. The manifolds 5 have an elongated shape that extends from one end in the longitudinal direction of the flow channel member 4 to the other end, and are respectively provided with openings 5a of the manifolds 5 that open at both ends thereof into the upper surface of the flow channel member 4.

The manifolds 5 are partitioned at a central portion in the longitudinal direction, which is a region connected to at least the pressurizing chamber 10, by partition walls 15 disposed with a distance therebetween in the transverse direction. The partition walls 15 have the same height as the manifolds 5 and completely partition the manifolds 5 into a plurality sub manifolds 5b, at a central portion in the longitudinal direction which is a region connected to the pressurizing chamber 10. With this configuration, the discharge holes 8 and the flow channels connected from the discharge holes 8 to the pressurizing chamber 10 can be disposed so as to be overlapped with the partition walls 15 in a plan view.

In FIG. 2, the entirety of the manifold 5 except for both end portions thereof is partitioned by the partition wall 15. Instead of this, the entirety of the manifold 5 except for either one of both end portions may be partitioned by the partition wall 15. Alternatively, only the vicinity of the opening 5a that opens into the upper surface of the flow channel member 4 may not be partitioned, and the partition wall 15 may be disposed to extend from the opening 5a in a depth direction of the flow channel member 4. In either way, by the presence of to an unpartitioned portion, a flow channel resistance decreases, making it possible to increase a liquid feed rate. Therefore, both end portions of the manifold 5 are preferably not partitioned by the partition wall 15.

A portion of the manifold 5 which is divided into a plurality of pieces is also referred to as the sub manifold 5b. In the present embodiment, two manifolds 5 are disposed independently, and the openings 5a are respectively disposed at both end portions of each of the manifolds 5. The single manifold 5 is provided with seven partition walls 15, and is divided into eight sub manifolds 5b. A width of the sub manifold 5b is larger than a width of the partition wall 15, thereby allowing a large amount of liquid to pass through the sub manifolds 5b. The seven partition walls 15 have a larger length as approaching a center in the width direction. An end of the partition wall 15, which is closer to the center in the width direction, is closer to an end of the manifold 5 on both ends of the manifold 5. This makes it possible to take a balance between a flow channel resistance generated by an outside wall of the manifold 5 and a flow channel resistance generated by the partition wall 15. It is therefore possible to minimize a pressure difference of the liquid at the end in a region of each of the sub manifolds 5b which is provided with an individual supply flow channel 14 that is a portion connected to the pressurizing chamber 10. A pressure difference in the individual supply flow channel 14 leads to a pressure difference applied to the liquid in the pressurizing chamber 10. It is therefore possible to reduce discharge variations by minimizing the pressure difference in the individual supply flow channel 14.

The flow channel member 4 is formed with the pressurizing chambers 10 extending two-dimensionally. The pressurizing chambers 10 are hollow regions having a planar form of an approximately rhombus shape whose corners are rounded, or an elliptical shape.

The pressurizing chambers 10 are connected to one another through the sub manifold 5b and an individual supply flow channel 14. There is one pressurizing chamber row 11 that is a row of the pressurizing chambers 10 connected to the sub manifold 5b so as to extend along the sub manifold 5b on each of both sides of the sub manifold 5b, namely, there are a total of two pressurizing chamber rows. Accordingly, 16 pressurizing chamber rows 11 are disposed with respect to the single manifold 5, and a total of 32 pressurizing chamber rows 11 are disposed over the entirety of the head body 2a. All of the pressurizing chambers 10 in these pressurizing chamber rows 11 are disposed at identical intervals in the longitudinal direction, for example, at intervals of 37.5 dpi.

A column of dummy pressurizing chambers 16 is disposed at an end of each of the pressurizing chamber rows 11. The dummy pressurizing chambers 16 of this dummy pressurizing chamber column are connected to the manifold 5 but not connected to the discharge hole 8. A dummy pressurizing chamber row in which the dummy pressurizing chambers 16 are arranged linearly is disposed outside the 32 pressurizing chamber rows 11. The dummy pressurizing chambers 16 of the dummy pressurizing chamber row are connected to neither the manifold 5 nor the discharge hole 8. Owing to these dummy pressurizing chambers 16, the structure (rigidity) of the circumference of the pressurizing chambers 10 disposed inwardly of and adjacent to the end becomes similar to the structure (rigidity) of other pressurizing chambers 10, thereby reducing differences in liquid discharge characteristics. A difference in circumferential structure has greater influence on the pressurizing chambers 10 that are located within a short distance and adjacent to one another in a length direction. The dummy pressurizing chambers are respectively disposed at both ends in the length direction. The influence in the width direction is relatively small. Therefore, the dummy pressurizing chamber is disposed only on the side close to the end of the head body 21a. This makes it possible to decrease the width of the head body 21a.

The pressurizing chambers 10 connected to the single manifold 5 are disposed in a lattice form that makes rows and columns along outer sides of the piezoelectric actuator substrate 21 having a rectangular shape. Consequently, individual electrodes 25 that are first electrodes formed from the outer sides of the piezoelectric actuator substrate 21 onto the pressurizing chambers 10 are disposed at equal intervals. Therefore, the piezoelectric actuator substrate 21 is less subjected to a deformation when forming the individual electrodes 25. When the piezoelectric actuator substrate 21 and the flow channel member 4 are connected to each other with an adhesive, a large deformation may lead to a risk that stress is applied to the displacement elements 30 close to the outer sides and variations occur in displacement characteristics. However, the variations can be reduced by minimizing the deformation. It is further insusceptible to the influence of the deformation owing to the dummy pressurizing chamber row of the dummy pressurizing chambers 16 disposed outside the pressurizing chamber rows 11 closest to the outer sides. The pressurizing chambers 10 belonging to the pressurizing chamber row 11 are disposed at equal intervals, and the individual electrodes 25 corresponding to the pressurizing chamber row 11 are also disposed at equal intervals. The pressurizing chamber rows 11 are disposed at equal intervals in the traverse direction, and rows of the individual electrodes 25 corresponding to the pressurizing chamber rows 11 are also disposed at equal intervals in the traverse direction. This eliminates portions particularly subjected to influence of crosstalk.

Although the pressurizing chambers 10 are disposed in the lattice form in the present embodiment, the pressurizing chambers 10 in the pressurizing chamber rows 11 adjacent to each other may be disposed in a zigzag form so as to locate alternately with each other. This contributes to further increasing a distance between the pressurizing chambers 10 belonging to the adjacent pressurizing chamber row 11, thereby further reducing crosstalk.

Regardless of how the pressurizing chamber rows 11 are disposed, the crosstalk is reducible by disposing so that the pressurizing chambers 10 belonging to the single pressurizing chamber row 11 are not overlapped with the pressurizing chambers 10 belonging to the adjacent pressurizing chamber row 11 in the longitudinal direction of the liquid discharge head 2 when the flow channel member 4 is viewed from above. Meanwhile a large distance between the pressurizing chamber rows 11 increases the width of the liquid discharge head 2. Therefore, accuracy of a mounting angle of the liquid discharge heads 2 with respect to the printer 1, and accuracy of a relative position of the liquid discharge heads 2 when using the liquid discharge heads 2 exert a large influence on a printing result. Therefore, by making a width of the partition walls 15 smaller than the sub manifold 5b, the influence on the printing result exerted by their respective accuracies is reducible.

The pressurizing chambers 10 connected to the single sub manifold 5b constitute two columns of the pressurizing chamber rows 11, and the discharge holes 8 connected from the pressurizing chambers 10 belonging to the single pressurizing chamber row 11 constitute a discharge hole row 9. The discharge holes 8 connected to the pressurizing chambers 10 belonging to the two pressurizing chamber rows 11 respectively open into different sides of the sub manifold 5b. In FIG. 4, the two discharge hole rows 9 are disposed on the partition walls 15, and the discharge holes 9 belonging to each of the discharge hole rows 9 are connected via the pressurizing chamber 10 to the sub manifold 5b close to the discharge holes 8. When disposed so as to avoid overlapping with the discharge holes 8 connected to the adjacent sub manifold 5b via the pressurizing chamber row 11 in the longitudinal direction of the liquid discharge head 2, it is possible to reduce crosstalk between the flow channels that connect the pressurizing chambers 10 and the discharge holes 8, thereby further minimizing crosstalk. When disposed so as to avoid overlapping of the entirety of the flow channels connecting the pressurizing chambers 10 and the discharge holes 8 in the longitudinal direction of the liquid discharge head 2, crosstalk is further reducible.

A pressurizing chamber group (in the same range as the displacement element group 31) is made up of the pressurizing chambers 10 connected to the single manifold 5. There are the two manifolds 5, and accordingly there are two pressurizing chamber groups. The pressurizing chambers 10 related to discharge in the pressurizing chamber groups are disposed in the same manner, namely, disposed at positions obtainable by a parallel shift in the transverse direction. These pressurizing chambers 10 are disposed approximately over the entirety of a region of the upper surface of the flow channel members 4 which is opposed to the piezoelectric actuator substrate 21, though there is a portion having a slightly wider interval, such as that between the pressurizing chamber groups. That is, the pressurizing chamber groups formed by these pressurizing chambers 10 occupy a region having approximately the same shape as the piezoelectric actuator substrate 21. The openings of the pressurizing chambers 10 are closed by the configuration that the piezoelectric actuator substrate 21 is connected to the upper surface of the flow channel member 4.

A flow channel connected to the discharge holes 8, which open into a discharge hole surface 4-1 on a lower surface of the flow channel member 4, extends from a corner part opposed to a corner part to which an individual supply flow channel 14 of the pressurizing chambers 10 is connected. The flow channel extends in a direction away from the pressurizing chambers 10 in a plan view. More specifically, the flow channel extend with a leftward or rightward deviation in a direction along a long diagonal line of the pressurizing chamber 10, while departing in this direction. This makes it possible to dispose the discharge holes 8 at intervals of 1200 dpi as a whole, while disposing the pressurizing chambers 10 in the lattice form in which intervals in each of the pressurizing chamber rows 11 is 37.5 dpi.

In other words, when the discharge holes 8 are projected so as to be orthogonal to a virtual straight line parallel to the longitudinal direction of the flow channel member 4, 16 discharge holes 8 connected to each of the manifolds 5, namely, a total of 32 discharge holes 8 are disposed at equal intervals of 1200 dpi. This makes it possible to form an image at a resolution of 1200 dpi in the longitudinal direction as a whole, by supplying the same color ink to all of the manifolds 5. The discharge hole 8 connected to the single manifold 5 is disposed at equal intervals of 600 dpi in a range R of the virtual straight line. This makes it possible to form a bicolor image at a resolution of 600 dpi in the longitudinal direction as a whole by supplying different colored inks to each of the manifolds 5. On this occasion, by using the two liquid discharge heads 2, it is possible to form a four-color image at a resolution of 600 dpi, enhance printing accuracy, and facilitate setting for printing than using the liquid discharge head that is printable at 600 dpi. The range R of the virtual straight line is covered with the discharge holes 8 connected from the pressurizing chambers 10 belonging to the single pressurizing chamber column disposed in the transverse direction of the head body 2a.

The individual electrodes 25 that are the first electrodes are respectively formed at positions opposed to the pressurizing chambers 10 on the upper surface of the piezoelectric actuator substrate 21. Each of the individual electrodes 25 includes an individual electrode body that is slightly smaller than the pressurizing chamber 10 and has a shape approximately similar to that of the pressurizing chamber 10, and an extracting electrode 25b extracted from the individual electrode body 25a. Similarly to the pressurizing chambers 10, the individual electrodes 25 constitute an individual electrode column and an individual electrode group. A surface electrode 28 for a common electrode, which is a second electrode electrically connected through a via hole 34 to a common electrode 24 that is a third electrode, is formed on the upper surface of the piezoelectric actuator substrate 21. The surface electrode 28 for the common electrode includes an outer peripheral part 28a that exists along an outer periphery of the piezoelectric actuator substrate 21 and has individual electrodes 25 on the inside thereof, and a protrusion 28b that is located inside the outer peripheral part 28a and extends between the individual electrodes 25 along a row direction in which the individual electrodes 25 are disposed side by side. Details of the shape of the surface electrode 28 for the common electrode is described later. The surface electrode 28 for the common electrode and the common electrode 24 are electrically connected to each other through a conductor in the via hole 34 disposed in the piezoelectric ceramic layer 21b.

The discharge holes 8 are disposed at positions to avoid a region that is opposed to the manifolds 5 disposed on a lower surface side of the flow channel member 4. The discharge holes 8 are further disposed in a region that is opposed to the piezoelectric actuator substrate 21 on the lower surface side of the flow channel member 4. These discharge holes 8 occupy, as a group, a region having approximately the same shape as the piezoelectric actuator substrate 21. Liquid drops are dischargeable from the discharge holes 8 by displacing the displacement elements 30 of the corresponding piezoelectric actuator substrate 21.

The flow channel member 4 included in the head body 2a has a laminate structure having a plurality of plates laminated one upon another. These plates are a cavity plate 4a, a base plate 4b, an aperture plate 4c, a supply plate 4d, manifold plates 4e to 4j, a cover plate 4k, and a nozzle plate 4l in descending order from the upper surface of the flow channel member 4. A large number of holes are formed in these plates. Each of these plates has a thickness of approximately 10-300 μm, thereby enhancing formation accuracy of the holes to be formed. The flow channel member 4 has a thickness of approximately 500 μm to 2 mm. Each of these plates are aligned and laminated so that these holes are communicated to each other and constitute the individual flow channel 12 and the manifold 5. In the head body 2a, components constituting the individual flow channel 12 are disposed close to each other at different positions. Specifically, the pressurizing chamber 10 is disposed on the upper surface of the flow channel member 4, the manifold 5 is disposed on an inside lower surface side, and the discharge hole 8 is disposed on the lower surface, so that the manifold 5 and the discharge hole 8 are connected to each other through the pressurizing chamber 10.

The holes formed in the foregoing plates are described below. These holes can be classified into the following ones. Firstly, there is the pressurizing chamber 10 formed in the cavity plate 4a. Secondly, there is a communication hole constituting the individual supply flow channel 14 connected from one end of the pressurizing chamber 10 to the manifold 5. This communication hole is formed in each of the plates, from the base plate 4b (specifically, an inlet of the pressurizing chamber 10) to the supply plate 4c (specifically, an outlet of the manifold 5). This individual supply flow channel 14 includes the aperture 6 that is a portion formed on the aperture plate 4c and having a small cross-sectional area of the flow channel.

Thirdly, there is a communication hole that constitutes a flow channel being communicated from the other end opposite to the end to which the individual supply flow channel 14 of the pressurizing chamber 10 is connected, to the discharge hole 8. This communication hole is also hereinafter referred to as a descender (partial flow channel) in the following description. The descender is formed in each of the plates, from the base plate 4b (specifically, an outlet of the pressurizing chamber 10) to the nozzle plate 4l (specifically, the discharge hole 8).

Fourthly, there is a communication hole constituting the sub manifold 5a. This communication hole is formed in the manifold plates 4e to 4j. Holes are formed in the manifold plates 4e to 4j so that partition portions serving as the partition walls 15 remain so as to configure the sub manifold 5b. The partition portions in each of the manifold plates 4e to 4j are brought into a state of being connected to each of the manifold plates 4e to 4j via a half-etched support portion (not shown in the drawing).

These communication holes are connected to one another to form the individual flow channel 12 that extends from the inlet for a liquid from the manifold 5 (the outlet of the manifold 5) to the discharge hole 8. The liquid supplied to the manifold 5 is discharged from the discharge hole 8 through the following route. Firstly, the liquid goes upward from the manifold 5 and passes through the individual supply flow channel 14 into one end of the aperture 6. The liquid then goes horizontally along an extending direction of the aperture 6 and reaches the other end of the aperture 6. Subsequently, the liquid goes upward from there and reaches one end of the pressurizing chamber 10. Further, the liquid goes horizontally along an extending direction of the pressurizing chamber 10 and reaches the other end of the pressurizing chamber 10. The liquid that has entered the descender from the pressurizing chamber 10 then mainly goes downward while moving in a horizontal direction. Thus, the liquid reaches the discharge hole 8 being opened into the lower surface, and is then discharged to the outside.

The piezoelectric actuator substrate 21 has a laminate structure made up of two piezoelectric ceramic layers 21a and 21b, each being a piezoelectric body. Each of these piezoelectric ceramic layers 21a and 21b has a thickness of approximately 20 μm. A thickness from a lower surface of the piezoelectric ceramic layer 21a to an upper surface of the piezoelectric layer 21b in the piezoelectric actuator substrate 21 is approximately 40 μm. Both the piezoelectric ceramic layers 21a and 21b extend over the pressurizing chambers 10. These piezoelectric ceramic layers 21a and 21b are made of, for example, lead zirconate titanate (PZT) based, $NaNbO_3$ based, $BaTiO_3$ based, $(BiNa)NbO_3$ based, or $BiNaNb_5O_{15}$ based ceramic material. The piezoelectric ceramic layer 21b operates as a diaphragm, and does not necessarily need to be the piezoelectric body. Alternatively, other ceramic layer and a metal plate, which are not the piezoelectric body, may be used.

The piezoelectric actuator substrate 21 has the common electrode 24 made of an Ag—Pd based metal material or the like, and the individual electrode 25 made of an Au based metal material or the like. As described above, the individual electrode 25 includes the individual electrode body 25a disposed at the position opposed to the pressurizing chamber 10 on the upper surface of the piezoelectric actuator substrate 21, and the extracting electrode 25b extracted from the individual electrode body 25a. A connection bump 26 is formed at a portion of one end of the extracting electrode 25b which is extracted beyond a region opposed to the pressurizing chamber 10. A connection bump 32 for a common electrode is formed on the common electrode 28. The connection bump 26 and the connection bump 32 for the common electrode are made of, for example, silver-palladium containing glass frit, and is formed in a convex shape with a thickness of approximately 15 μm. The connection bump 26 and the connection bump 32 for the common electrode are electrically connected to an electrode disposed on the signal transmission section 60. Although the details thereof are described later, a drive signal is to be supplied from the control section 88 to the individual electrode 25 via the signal transmission section 60. The drive signal is supplied on a fixed cycle in synchronization with a transport velocity of the printing medium P.

The common electrode 24 is formed approximately over the entire surface in a planar direction in a region between the piezoelectric ceramic layer 21a and the piezoelectric ceramic layer 21b. That is, the common electrode 24 extends to cover all the pressurizing chambers 10 in a region opposed to the piezoelectric actuator substrate 21. The common electrode 24 has a thickness of approximately 2 μm. The common electrode 24 is connected through the via hole 34 formed in and extending through the piezoelectric ceramic layer 21a to the surface electrode 28 for the common electrode which is formed at the position to avoid the electrode groups of the individual electrodes 25 on the piezoelectric ceramic layer 21a. The common electrode 24 is grounded and held at ground potential. Similarly to a large number of the individual electrodes 25, the surface electrode 28 for the common electrode is directly or indirectly connected to the control section 88.

A portion of the piezoelectric ceramic layer 21a which is sandwiched between the individual electrode 25 and the common electrode 24 is polarized in a thickness direction, and serves as a displacement element 30 having a unimolf structure which is displaced upon application of a voltage to the individual electrode 25. More specifically, when the individual electrode 25 is set at a different potential from that of the common electrode 24 and an electric field is applied to the piezoelectric ceramic layer 21a in a polarization direction thereof, a portion to which the electric field has been applied acts as the active part that is distorted by piezoelectric effect. With this configuration, a portion of the piezoelectric ceramic layer 21a which is sandwiched between the electrodes (an active part) expands and contracts in the planar direction when the control section 88 brings the individual electrode 25 into a predetermined positive or negative potential with respect to the common electrode 24 so that the electric field and the polarization are in the same direction. Meanwhile the piezoelectric ceramic layer 21b that is a non-active layer is not subjected to the influence of the electric field, and therefore does not contract spontaneously but attempts to restrict deformation of the active part. Consequently, a difference of distortion in a planarization direction occurs between the piezoelectric ceramic layer 21a and the piezoelectric ceramic layer 21b. Therefore, the piezoelectric ceramic layer 21b is deformed so as to protrude toward the pressurizing chamber 10 (unimolf deformation).

A liquid discharge operation is described below. The displacement element 30 is driven (displaced) by a drive signal supplied through a driver IC to the individual electrode 25 under the control of the control section 88. Although the liquid is dischargeable by different drive signals in the present embodiment, a so-called pull ejection driving method is described below.

The individual electrode 25 is set to a higher potential than the common electrode 24 (hereinafter referred to as a high potential) in advance. The individual electrode 25 is temporarily set to the same potential as the common electrode 24 (hereinafter referred to as a low potential) every time a discharge request occurs, and is thereafter set again to the high potential at predetermined timing. Thereby, the piezoelectric ceramic layers 21a and 21b (start to) return to their original (flat) shape at the timing that the individual electrode 25 has the low potential, and the volume of the pressurizing chamber 10 is increased compared to an initial state thereof (the state that the potentials of both electrodes are different from each other). Upon this, a negative pressure is applied to the liquid in the pressurizing chamber 10. Subsequently, the liquid in the pressurizing chamber 10 starts to vibrate in an inherent vibration period. Specifically, the volume of the pressurizing chamber 10 firstly starts to increase, and the negative pressure is gradually decreased. Subsequently, the volume of the pressurizing chamber 10 reaches a maximum and the pressure reaches approximately zero. Then, the volume of the pressurizing chamber 10 starts to decrease, and the pressure starts to increase. Thereafter, the individual electrode 25 is set to the high potential at the timing that the pressure reaches an approximately maximum. Upon this, the initially applied vibration and the subsequently applied vibration overlap with each other, and a larger pressure is applied to the liquid. This pressure propagates through the descender and causes the liquid to be discharged from the discharge hole 8.

That is, liquid droplets are dischargeable by supplying the individual electrode 25 with a drive signal of a pulse that keeps the low potential with reference to the high potential for a certain period of time. Provided that this pulse width is an AL (acoustic length) that is half of the time of the inherent vibration period of the liquid in the pressurizing chamber 10, it is in principle possible to maximize the discharge velocity and the amount of discharge of the liquid. The inherent vibration period of the liquid in the pressurizing chamber 10 is considerably influenced by physical properties of the liquid and the shape of the pressurizing chamber 10, and is also influenced by physical properties of the piezoelectric actuator substrate 21 and characteristics of the flow channel connected to the pressurizing chamber 10.

The pulse width is practically set to a value of approximately 0.5-1.5 AL because of other factors to be considered, such as making liquid drops discharged into one. The amount of discharge can be decreased by setting the pulse width to a value beyond the AL. The pulse width is therefore set to the value beyond the AL in order to decrease the amount of discharge.

A large number of individual electrodes 25 are disposed to achieve high resolution on the piezoelectric actuator substrate 21. Increasing the size of the liquid discharge head 2 leads to the problem that, for example, it is necessary to enhance alignment accuracy needed for disposing them. Therefore, the individual electrodes 25 are preferably disposed in a possible minimum range, and an area to dispose the surface electrode 28 for the common electrode is also preferably decreased.

Meanwhile the piezoelectric actuator substrate 21 and the flow channel member 4 are adhesively connected to each other with an adhesive. Therefore, the adhesive and a resin for protecting an end surface of the piezoelectric actuator substrate 21 may flow onto the piezoelectric actuator substrate 21. When the adhesive and the like reach the displacement element 30, the displacement of the displacement element 30 may be impaired, and consequently discharge characteristics may change or it may fail to discharge. To prevent the adhesive from reaching the displacement element 30, an outer peripheral part 28a disposed so as to surround the entirety of the individual electrodes 25 needs to dispose as a part of the surface electrode 28 for the common electrode. The surface electrode 28 for the common electrode is raised above the surface of the piezoelectric ceramic layer 21b. Therefore, the outer peripheral part 28a of the surface electrode 28 for the common electrode dams up the adhesive and dams up part of the adhesive, thereby decreasing the amount of the adhesive flowing toward the individual electrodes 25. By disposing the outer peripheral part 28a along the outer periphery of the piezoelectric actuator substrate 21, the adhesive flowing toward the piezoelectric actuator substrate 21 from the outside thereof can be dammed up near the end portion of the piezoelectric actuator substrate 21.

The surface electrode 28 for the common electrode needs to be electrically connected to the common electrode 24 through the conductor in the via hole 34. The via hole 34 is formed in the piezoelectric ceramic layer 21b before firing. Therefore, a position of the via hole 34 on a plane after the firing may vary due to firing variations of the piezoelectric ceramic layer 21b. The outer peripheral part 28a of the surface electrode 28 for the common electrode is a region that surrounds the entirety of the individual electrodes 25 and has a large full length along the outer periphery of the piezoelectric actuator substrate 21. Hence, when an attempt is made to establish an electrical connection by disposing the via hole 34 at the outer peripheral part 28a, it becomes necessary to increase the width of the outer peripheral part 28a in order to cope with variations in expansion and contraction of the via hole 34. This is, however, unpreferable because the area of the surface electrode 28 for the common electrode is increased.

Instead, the protrusion 28b that extends inside the outer peripheral part 28a is disposed as a part of the surface electrode 28 for the common electrode, and the via hole 34 is disposed there. This enhances reliability of the electrical connection through the via hole 34. An arrangement of the protrusion 28b between the rows of the individual electrodes 25 may cause a region where no image can be printed in a resolution direction. However, this region is avoidable by disposing the protrusion 28b between the rows of the individual electrodes 25. This is preferable. On that occasion, the protrusion 28b preferably extends in a row direction because any misregistration with respect to the via hole 34 is less apt to occur. When the liquid discharge heads 2 print different inks at the same time (such as a multi-color printing), it is preferable to separately dispose the discharge holes 8 through which the different inks are discharged because, for example, a mixture of the inks when printing in a wine pink is less apt to occur. By separately disposing the discharge holes 8 in different regions, the individual electrodes 25 are also similarly disposed separately. The protrusion 28b is preferably disposed in a region between the rows of the individual electrodes 25 so obtained. In the multi-color printing, there occurs a mixture of colors between black (K) and colors of magenta (M), yellow (Y), and cyan (C). This is noticeable. It is therefore preferable to increase a distance between black (K) and other colors than those between magenta (M), yellow (Y), and cyan (C), in order to dispose the protrusion 28b at a portion corresponding to a region so obtained.

The individual electrodes 25 and the surface electrodes 28 for the common electrode are to be burned after firing the piezoelectric ceramic layer 21b, and hence are formable with higher accuracy of position than the via hole 34. Thus, the electrical connection between the signal transmission section 60 and the surface electrode 28 for the common electrode can be made by the outer peripheral part 28a. By making this connection somewhere other than the protrusion 28b, there is no need to increase the area of the protrusion 28b, thus permitting downsizing of the piezoelectric actuator substrate 21.

The protrusion 28b may be disposed at a plurality of locations in a column direction (a direction intersecting the row direction). However, the piezoelectric actuator substrate 21 is downsizable by disposing the protrusion 28b at a single location. On that occasion, the protrusion 28b is preferably disposed between black (K) and other colors as described above. The protrusion 28b may be disposed continuously so as to cross the outer peripheral part 28a in the row direction. It is however preferable to dispose the protrusion 28b at one end and the other end in the row direction. By so disposing, it is possible to reduce warpage and distortion of the piezoelectric actuator substrate 21 during the firing of the electrodes. Although the protrusion 28*b* may be disposed only either one of the ends in the row direction, reliability of the electrical connection with the common electrode 24 can be enhanced by disposing the protrusion 28*b* at both ends and the via hole 34 on both ends.

It is preferable to intermittently dispose a dummy electrode 36 that is a fifth electrode between the two protrusions 28*b* so disposed. This brings a density of the electrode located there close to a density of the electrode disposed as the individual electrode 25, thereby minimizing the warpage and distortion of the piezoelectric actuator substrate 21. The reason by the dummy electrode 36 is disposed intermittently is that the density becomes too high by disposing it continuously. The dummy electrode 36 may not particularly have any electrical function. However, for the purpose of evaluating characteristics of the piezoelectric actuator substrate 21 and the liquid discharge head 2, the dummy electrode 36 may be configured to permit measurement of permittivity (capacity) of the piezoelectric ceramic layer 21*b*, and also permit measurements of an amount of displacement and a resonance frequency by disposing a dummy pressurizing chamber at the flow channel member 4 underlying the dummy electrode 36 so as to allow displacement of that portion.

The large number of wiring lines 60*c* are disposed on the signal transmission section 60. Hence preferably, the signal transmission section 60 is long in one direction, and the wiring lines 60*c* extend in the one direction and are disposed side by side in a direction (width direction) intersecting the one direction. The surface electrode 28 for the common electrode serves as a so-called ground, and therefore the wiring line 60*c* to be connected thereto is preferably thicker than other wiring lines 60*c*, and also preferably disposed at an end portion in the width direction of the signal transmission section 60. Accordingly, the electrical connection between the signal transmission section 60 and the surface electrode 28 for the common electrode is preferably made on two opposing sides of the outer peripheral part 28*a* of the surface electrode 28 for the common electrode which are respectively located at the end portions in the width direction.

Although the foregoing description has been made using the liquid discharge head 2, the piezoelectric substrate is usable as actuators used for other than the liquid discharge head, such as speakers, buzzers, sensors, and filters that configure electric circuits. When these piezoelectric substrates are adhered to other member with and adhesive, and their circumferences are covered with a resin or the like, they have effects of preventing flowing-in of the adhesive, resin, or the like. Particularly in an assembly having the piezoelectric substrate and a wiring board being electrically connected to each other is useful, for example, for sensors including a large number of sensor elements.

Figure 6A:
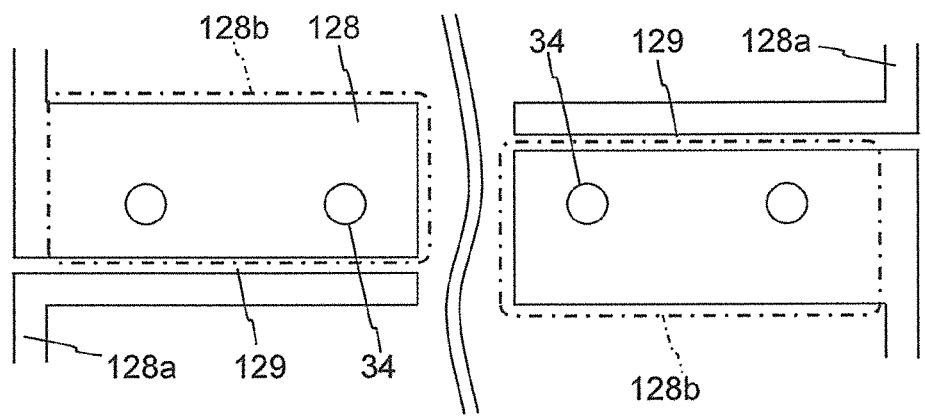
FIGS. 6(a) and 6(b) are enlarged plan views of a circumference of a protruded part of a piezoelectric substrate according to other embodiment of the present invention.
Figure 6B:
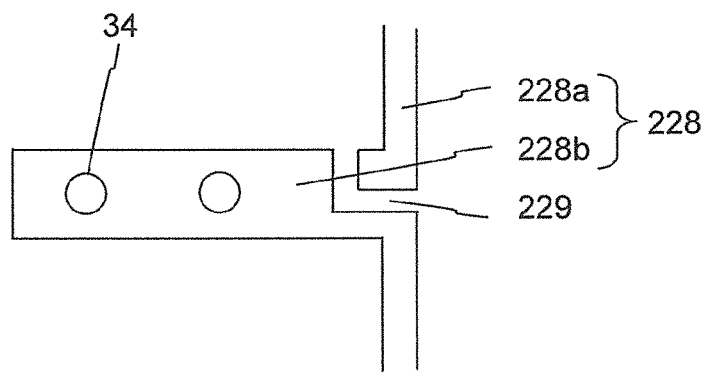

FIGS. 6(*a*) and 6(*b*) and FIGS. 7(*a*) and 7(*b*) are enlarged plan views of circumferences of protrusions 128*b*, 228*b*, 328*b*, and 428*b* of surface electrodes (second electrodes) 128, 228, 328, and 428 for a common electrode, respectively, of a piezoelectric substrate 21 according to other embodiment of the present invention. A basic configuration of the piezoelectric substrate 21 is the same as that shown in FIG. 3. FIG. 6(*a*) shows in enlarged dimension each of two protrusions 128*b* that are located at one of inter-rows of the individual electrodes 25 and are oppositely disposed near the end portion of the piezoelectric substrate 21. FIG. 6(*b*) and FIGS. 7(*a*) and 7(*b*) respectively show in enlarged dimension one of two protrusions 228*b*, one of two protrusions 328*b*, and one of two protrusions 428*b*.

The surface electrode 28 for the common electrode shown in FIG. 3 is connected entirely. Therefore, even when there is no continuity between the single via hole 34 and the surface electrode 28 for the common electrode, it is undetectable by a test that merely checks continuity. Whereas in the presence of the via hole 34 having no continuity, a drive state of the displacement element 39 may vary, for example, due to the fact that a potential around the via hole 34 is not sufficiently reduced to a ground. In order to avoid this situation, the surface electrode 28 for the common electrode is preferably divided into some sections so that continuity is checkable on a section basis.

On the surface electrode 128 for the common electrode on a left side in the drawing of the piezoelectric substrate in FIG. 6(*a*), a separation part 129 is disposed under the via hole 34 in the drawing. On the surface electrode 128 for the common electrode on a right side in the drawing, the separation part 129 is disposed above the via hole 34 in the drawing. The separation part 129 is preferably in a line form (slit form) whose width is smaller than its length in order to prevent the adhesive from entering inside the outer peripheral part 128*a*. A ratio of the width to the length is preferably ½ or less, more preferably ⅕ or less, and particularly preferably ¹⁄₁₀ or less. Consequently, the surface electrode 128 for the common electrode is separated into two sections in order to avoid continuity (more specifically continuity by direct current or low frequency alternating current) between the section including the outer peripheral part 128*a* located above the piezoelectric substrate 21 and the protrusion 128*b* on the left side, and the section including the outer peripheral part 128*a* located under the piezoelectric substrate 21 and the protrusion 128*b* on the right side. This makes it possible to independently test the continuity of the via hole 34 in these two sections. In the present embodiment, the two via holes 34 are disposed in the single protrusion 128*b*, and the necessity for testing their respective continuity is low because these via holes 34 are disposed close to each other.

Even when there are three or more protrusions 128*b*, it is preferable to divide into two or more sections so as to include at least a single protrusion 128*b* by disposing the separation part 129. This permits the test on the section basis. More preferably, the separation part 129 is disposed so that the single protrusion 128*b* is included in each of the sections. This permits the test in each of the protrusions 128*b*.

The separation part 129 is disposed at the protrusion 128*b*, and therefore is far away from the individual electrodes 25, thus making it difficult for the adhesive to pass through the separation part 129 and reach the individual electrodes 25. Particularly, the separation part 129 penetrates the protrusion 128*b* in the row direction of the individual electrodes 25, and therefore has a large length. This makes it difficult for the adhesive to enter inside of the surface electrode 128 for the common electrode through the separation part 129. Even when entered, the end of the separation part 129 opens into an end of the protrusion 128*b* in the row direction of the individual electrodes 25, and therefore is far away from the individual electrodes 25. This makes it difficult for the adhesive to reach the individual electrodes 25 through the separation part 129.

In FIG. 6(*b*), a separation part 229 extends and bents from one direction to another direction in the protrusion 228*b*. This increases the length of the separation part 229, making it difficult for the adhesive to reach the individual electrodes 25. The separation part 229 may be further bent into a shape having a corner portion. This makes it easier for the adhesive to stay at the corner portion, making it difficult for the adhesive to reach the individual electrodes 25. Similarly to the protrusion 228b shown in FIG. 6(a), there are the protrusion 228b and the corresponding protrusion 228b in a point symmetrical shape, and the surface electrode 228 for the common electrode is divided into two sections by the separation section 229. The same is also true for protrusions 328b and 428b as described below.

In FIG. 7(a), a separation part 329 is disposed between the protrusion 328b and the row of the individual electrodes 25 closest to the protrusion 328b. This makes more difficult for the adhesive to reach the individual electrodes 25 than disposing the separation part 329 at a position in the row direction with respect to the individual electrodes 25. This is preferable.

In FIG. 7(a), a fourth electrode 328c is disposed inside the outer peripheral part 328a located at the position of the separation part 329. It is therefore difficult for the adhesive that has passed through the separation part 329 to reach the individual electrodes 25 by the presence of the fourth electrode 328c. The fourth electrode 328c needs to be formed at the same time when the surface electrode 328 for the common electrode is formed by printing and firing.

In FIG. 7(b), a separation part 429 is disposed between the protrusion 428b and the row of the individual electrodes 25 closest to the protrusion 428b, and the separation part 429 is also bent toward the protrusion 428b on a side of an outer peripheral part 428a which is close to the individual electrodes 25. It is therefore difficult for the adhesive to pass through the separation part 429 by being so bent, and it is also difficult for the adhesive to reach the individual electrodes 25 because an end of the separation part 429 is disposed at a position far away from the individual electrodes 25.

The fourth dummy electrodes 328d and 428d are arranged to have an approximately symmetrical electrode arrangement in order to minimize warpage and deformation of the piezoelectric substrate 21.

DESCRIPTION OF REFERENCE NUMERALS 1 color inkjet printer
2 liquid discharge head
2a head body
4 flow channel member
4a-4l plates (of flow channel member)
4-1 discharge hole surface
4-2 pressurizing chamber surface
5 manifold
5a opening (of manifold)
5b sub manifold
6 aperture
8 discharge hole
9 discharge hole row
10 pressurizing chamber
11 pressurizing chamber row
12 individual flow channel
14 individual supply flow channel
15 partition wall
16 dummy pressurizing chamber
21 piezoelectric actuator substrate (piezoelectric substrate)
21a piezoelectric ceramic layer (diaphragm)
21b piezoelectric ceramic layer
24 common electrode (third electrode)
25 individual electrode (first electrode)
25a individual electrode body
25b extracting electrode
26 connection bump
28, 128, 228, 328, 428 surface electrode for common electrode (second electrode)
28a, 128a, 228a, 328a, 428a outer peripheral part
28b, 128b, 228b, 328b, 428b protrusion
30 displacement element
32 connection bump for common electrode
34 via hole
36 dummy electrode (fifth electrode)
30 displacement element (piezoelectric element)
60 signal transmission section (wiring board)
60c wiring line
70 head-mounted frame
72 head group
80a paper feed roller
80b recovery roller
82a guide roller
82b transport roller
88 control section
328c fourth electrode
328d, 428d fourth dummy electrode
129, 229, 329, 429 separation part
P printing paper

The invention claimed is:

1. A flat plate shaped piezoelectric substrate comprising:
a piezoelectric ceramic layer;
a plurality of first electrodes and a second electrode disposed on one main surface of the piezoelectric ceramic layer; and
a third electrode disposed on another main surface of the piezoelectric ceramic layer so as to oppose to the first electrodes,
wherein the second electrode comprises an outer peripheral part disposed so as to surround an entirety of the first electrodes, and a protrusion extending from the outer peripheral part toward inside of the outer peripheral part when the piezoelectric substrate is viewed from above,
wherein the second electrode and the third electrode are electrically connected to each other at the protrusion, and
wherein the outer peripheral part is used for an electrical connection with an outside.

2. The piezoelectric substrate according to claim 1, wherein there are two or more of the protrusions, and there is a separation part to divide the second electrode into a plurality of sections in order to avoid continuity between the protrusions.

3. The piezoelectric substrate according to claim 2, wherein the separation part is disposed at the protrusions.

4. The piezoelectric substrate according to claim 3, wherein the first electrodes are disposed to form a plurality of rows,
wherein the protrusions are disposed between the first electrodes and along the row direction, and
wherein the separation part is connected to an end of the protrusion in the row direction.

5. The piezoelectric substrate according to claim 3, wherein the separation part is in a line form and bent in the protrusion.

6. The piezoelectric substrate according to claim 2, wherein the first electrodes are disposed to form a plurality of rows, and the separation part is disposed between the protrusion and the row of the first electrodes closest to the protrusion.

7. The piezoelectric substrate according to claim 6, wherein a fourth electrode is disposed inside the outer peripheral part at a position of the separation part.

8. The piezoelectric substrate according to claim 6, wherein the separation part is in a line form and bent toward the protrusion on a side of the outer peripheral part which is close to the first electrodes.

9. The piezoelectric substrate according to claim 1,
wherein the first electrodes are disposed to form a plurality of rows,
wherein a plurality of fifth electrodes are disposed intermittently from the protrusion on the one main surface and along a direction in which the protrusion extends in the row direction.

10. An assembly comprising:
a piezoelectric substrate according to claim 1; and
a wiring board disposed to face the piezoelectric substrate and comprising a plurality of wiring lines electrically connected to the first electrodes and the second electrode,
wherein the wiring board is long in one direction, and the wiring lines extend along the one direction, and
wherein the outer peripheral part has a shape along sides of a rectangular shape, two opposing sides of the outer peripheral part are disposed along the one direction, and the second electrode and each of the wiring lines are electrically connected to each other on the two sides of the second electrode.

11. A liquid discharge head comprising:
a flow channel member comprising a plurality of discharge holes and a plurality of pressurizing chambers respectively connected to the discharge holes; and
an assembly according to claim 10,
wherein the flow channel member and the piezoelectric substrate are connected to each other with an adhesive, and
wherein upon application of a voltage to between the first electrode and the second electrode, the piezoelectric ceramic layer is deformed to pressurize a liquid in the pressurizing chambers.

12. A recording device comprising:
a liquid discharge head according to claim 11;
a transport section to transport a recording medium to the liquid discharge head; and
a control section to control the liquid discharge head.

13. A liquid discharge head comprising:
a flow channel member comprising a plurality of discharge holes and a plurality of pressurizing chambers respectively connected to the discharge holes; and
a piezoelectric substrate according to claim 1,
wherein the flow channel member and the piezoelectric substrate are connected to each other with an adhesive, and
wherein upon application of a voltage to between the first electrode and the second electrode, the piezoelectric ceramic layer is deformed to pressurize a liquid in the pressurizing chambers.

14. A recording device comprising:
a liquid discharge head according to claim 13;
a transport section to transport a recording medium to the liquid discharge head; and
a control section to control the liquid discharge head.

* * * * *